United States Patent [19]
St. John et al.

[11] Patent Number: 5,761,803
[45] Date of Patent: Jun. 9, 1998

[54] METHOD OF FORMING PLUGS IN VIAS OF A CIRCUIT BOARD BY UTILIZING A POROUS MEMBRANE

[76] Inventors: Frank St. John, 420 S. Third St., Rockford, Ill. 61104; Felix Rodriguez, 264 Oxford La., Bloomingdale, Ill. 60108; Susan Christensen, 4704 N. Olcott Ave., Harwood Heights, Ill. 60656

[21] Appl. No.: 673,173

[22] Filed: Jun. 26, 1996

[51] Int. Cl.⁶ .................................................. H05K 3/40
[52] U.S. Cl. .................... 29/852; 29/33 M; 29/884; 29/885; 174/257; 174/265; 427/97
[58] Field of Search ................... 29/852, 846, 874, 29/884, 33 M, 885; 427/96, 97, 282; 174/262, 257, 265; 439/91, 591

[56] References Cited

U.S. PATENT DOCUMENTS

| | | | |
|---|---|---|---|
| 2,848,359 | 8/1958 | Talmey | 29/885 X |
| 4,107,837 | 8/1978 | Chang | 29/885 X |
| 4,323,593 | 4/1982 | Tsunashima | 427/97 |
| 4,908,940 | 3/1990 | Amano et al. | 427/97 X |
| 4,925,723 | 5/1990 | Bujatti et al. | 29/852 X |
| 4,964,948 | 10/1990 | Reed | 29/852 X |
| 5,274,916 | 1/1994 | Kawabata et al. | 29/852 X |
| 5,456,004 | 10/1995 | Swany | 29/884 X |

FOREIGN PATENT DOCUMENTS

| | | | |
|---|---|---|---|
| 0059892 | 3/1989 | Japan | 29/852 |
| 0184996 | 7/1989 | Japan | 29/852 |
| 2309692 | 12/1990 | Japan | 29/885 |
| 4269485 | 9/1992 | Japan | 29/33 M |
| 4296483 | 10/1992 | Japan | 29/33 M |
| 6045400 | 2/1994 | Japan | 29/885 |

*Primary Examiner*—Peter Vo
*Attorney, Agent, or Firm*—David L. Newman

[57] ABSTRACT

A conductive plug is formed in drilled-through vias of a printed circuit board of a polymer ink composition by a method of flooding the vias of a printed circuit board having parchment paper attached to an underside while the printed circuit board is on a vacuum table to form a first layer of the conductive plug within the vias. A second layer of the conductive plug within the via is formed by placing a stencil over the circuit board and flooding the holes of the stencil in order to form a second layer of the conductive plug within the vias of the printed circuit board.

18 Claims, 3 Drawing Sheets

5,761,803

METHOD OF FORMING PLUGS IN VIAS OF A CIRCUIT BOARD BY UTILIZING A POROUS MEMBRANE

BACKGROUND OF THE INVENTION

The present invention relates to conductive elements of a printed circuit board and, in particular, a conductive plug of a printed circuit board and a method of forming conductive plugs.

Plated-through holes are commonly used in printed circuit boards in order to transfer electrical signals from one side of a printed circuit board to a second side of the printed circuit board. Such plated-through holes also commonly receive pins or contacts which may be soldered within the plated-through hole in order to electrically connect an element to the printed circuit board. The process of forming plated-through holes commonly involved the electroless copper plating of the printed circuit board and the holes or vias in the printed circuit board. This process is expensive and only coats the vias inside surface, leaving behind a hole or via in the printed circuit board. In applications where it is not desired to insert a contact or pin within the plated-through hole and only to use the hole to carry electrical signals from one side of the board to the other side of the board, it is desirable to completely fill the hole so that a smooth planar surface remains on both sides of the printed circuit board. Therefore, it is an object of the present invention to provide a printed circuit board having conductive plugs for transferring current from one side of the board to another.

It is a further object of the present invention to provide for a conductive plug which has minimal voids.

It is a further object of the present invention to provide a method of forming conductive plugs within drilled-through vias of a printed circuit board.

SUMMARY OF THE INVENTION

The present invention provides for a printed circuit board having a conductive plug formed of polymer ink including a first layer filling the majority of the via and a second layer filling the remainder of the via. The conductive plug may include the second layer being scrubbed so that it is planar with the surface of the printed circuit board. The conductive plug may have no voids in 90% of the plug volume. The printed circuit board may include an array of conductive plugs and the printed circuit board includes conductive traces adhered over the surface of the printed circuit board and the array of conductive plugs.

A method of forming conductive plugs in a printed circuit board is provided including the steps of attaching parchment paper to the underside of a circuit board, placing the circuit board on a vacuum table, flooding polymer ink over the circuit board, pushing the ink into the vias of the circuit board using a squeegee, wiping excess ink off the top side of the circuit board, curing the ink, placing a stencil over the circuit board and aligning holes of the stencil with the vias of the circuit board, flooding the stencil with conductive ink, pushing the ink through the holes in the stencil using a squeegee; and curing the ink. The method may include the step of curing a second layer of conductive ink and scrubbed in order to provide a planar surface along the upper surface of the circuit board. The method may include using a metal-filled polymer ink for the first layer within the vias. The method may include the step of curing process for both the first and second layers by placing the circuit board at 150° C. for fifteen minutes. The method may include using stencil holes that are 5 mm larger in diameter than the via diameters to be filled. The method may include using the conductive ink to form the second layer that has a lower viscosity than the ink used to form the first layer.

These and other features of the invention are set forth below in the following detailed description of the presently preferred embodiments.

DETAILED DESCRIPTION OF THE PRESENTLY PREFERRED EMBODIMENTS

Figure 1:
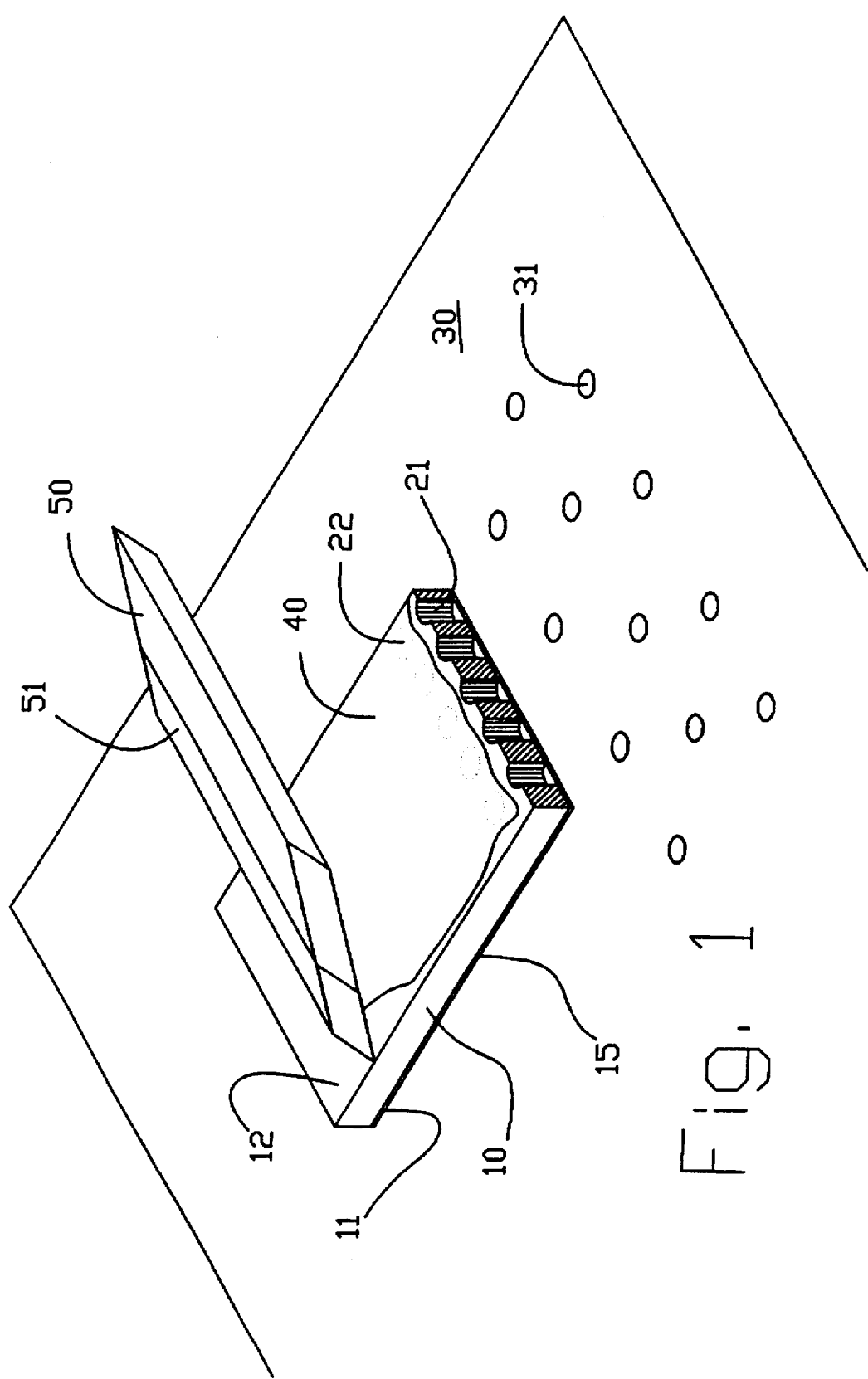
FIG. 1 is a perspective view of the first steps of forming the invention.
Figure 2:
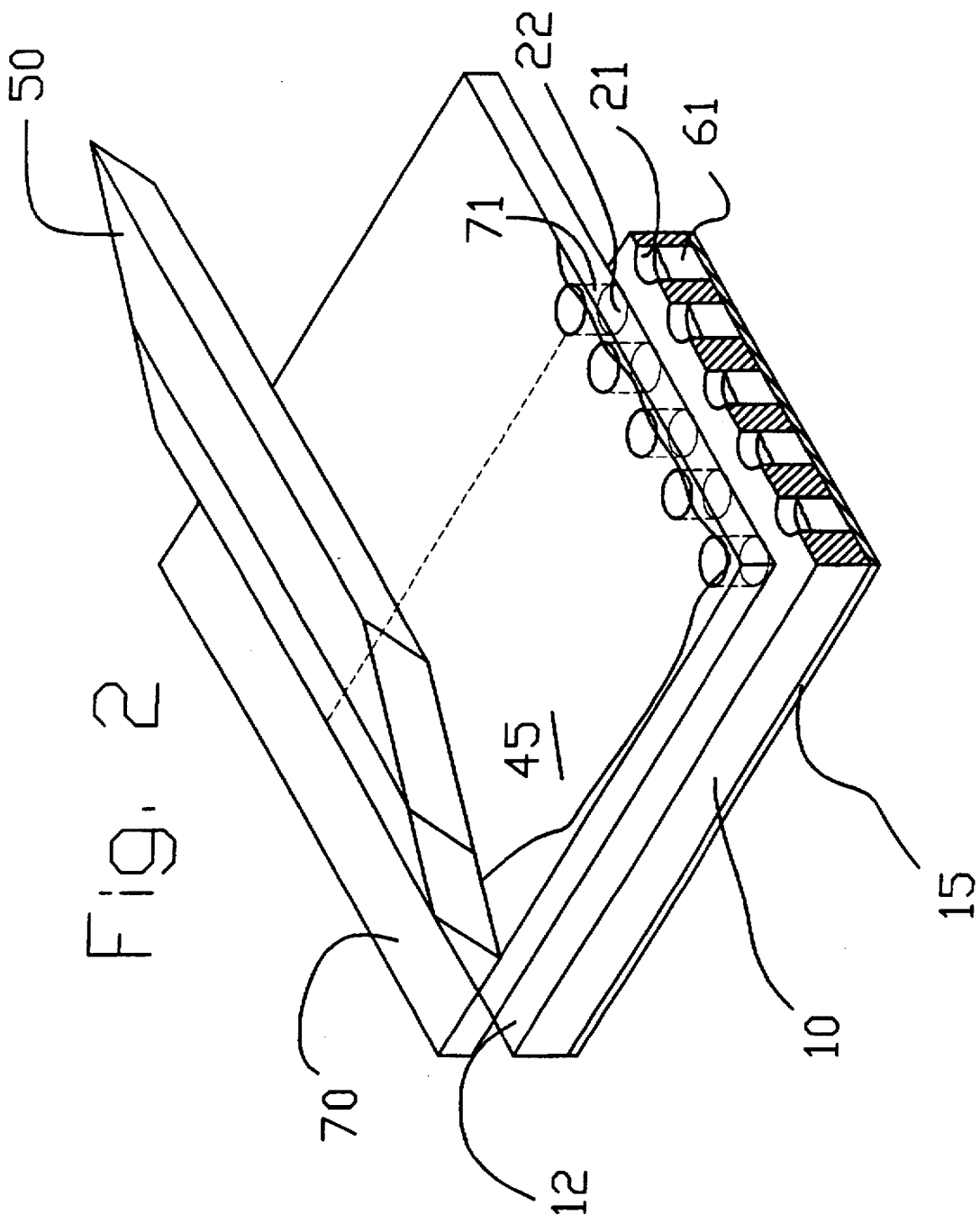
FIG. 2 is a perspective view of the later steps of forming the present invention.
Figure 3:
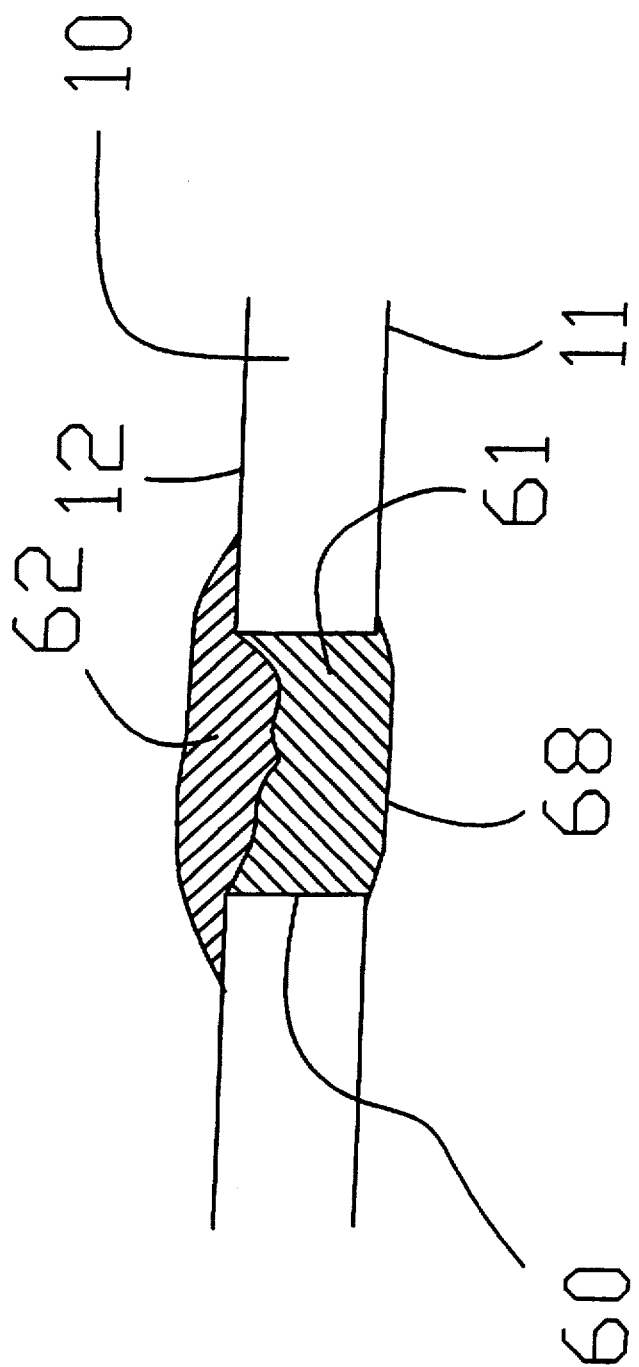
FIG. 3 is a side elevation cut-away view of the conductive plug of the present invention.

The present invention is best understood with reference to FIGS. 1–3. FIG. 1 is a perspective view of the first step of forming the conductive plugs of the present invention. A printed circuit board 10 has parchment paper 15 attached to the underside 11 of the printed circuit board 10. In a preferred embodiment, Wilton parchment paper is used and is attached to the underside 11 of the printed circuit board 10 by any means such as via spray 3M Remount Repositional Adhesive. The parchment paper allows for air to pass through when placed on a vacuum table. The printed circuit board 10 has predrilled vias formed in an array throughout the printed circuit board 10. FIG. 1 shows a cross-section of a row of vias 21 and a second row of vias 22. In a preferred embodiment, the row of vias will continue across the surface of the printed circuit board 10 and may be positioned in any desired location where it is desirable to carry electrical signals from the top side 12 of the printed circuit board 10 to the underside 11. However, for simplicity sake, FIG. 1 only shows the two rows of vias 21,22. In a preferred embodiment, the parchment paper 15 covers all of the vias 21,22 in the printed circuit board and is cut to align with the edges of the circuit board or overhang beyond the edges of the printed circuit board 10. The printed circuit board 10 with the parchment paper 15 attached thereto is then placed onto a vacuum table 30. The vacuum table 30 includes vacuum holes 31. In a preferred embodiment, the vacuum holes 31 have a diameter of 1.0 mm and provide for a suction force of 10 L/min.

Conductive ink 40 is then poured onto the upper surface 12 of the printed circuit board and is flooded into the vias 21,22 of printed circuit board 10. In a preferred embodiment, a thick-film, metal-filled polymer ink such as silver-filled epoxy is used having a viscosity of approximately 200,000 cP±50,000 cP. Also, such polymer inks are available from DuPont, Inc., such as Product No. 5504N. This metal ink is used to form a first layer 61 of the conductive plug 60 (see FIG. 3). The ink is pushed into the vias 21,22 by using a squeegee 50. In a preferred embodiment, the squeegee 50 has a rubber base 51 having a hardness of 70 durometer. The squeegee 50 is moved twice from left to right and twice from right to left at a speed of one foot per second. The action of movement of the squeegee 50 across the upper surface 12 of the printed circuit board 10 and the action of the vacuum table 30 will cause the ink to fill the vias down to the parchment paper which will hold the ink on the bottom side 11 of the printed circuit board 10. At the upper surface 12 of the printed circuit board 10, the ink will be mounded over and out of the vias 21,22 (see FIG. 3). The excess ink is then wiped off the upper surface 12 of the printed circuit board 10 using a solvent. This will cause the ink in the vias 21,22 to be depressed below the upper surface 12 as shown as the first layer 61 of the conductive plug in FIG. 2. The first layer 61 is then cured at 150° C. for fifteen minutes.

Turning to FIG. 2, the process of forming the second layer of the conductive plug is shown. The printed circuit board 10 is shown still having the parchment paper 15 attached thereto and having the first layer 61 of the conductive plug filling the via 21. A template 70 having an array of holes 71 is placed over the upper surface 12 of the printed circuit board 10. The holes 71 of the template 70 are 5 mm larger in diameter than the vias 21,22 of the printed circuit board 10 to insure that the vias 21,22 are completely filled with ink. The holes 71 of the template 70 are aligned over the corresponding vias 21,22 of the printed circuit board 10. In FIG. 2, the template 70 has been cut away so that the vias 21 may be clearly seen having the first layer 61 of the conductive plug therein and only vias 22 are shown having corresponding holes 71 of the template 70 aligned thereto. However, it may understood that the template 70 continues and includes a row of holes which will correspond to the vias 21 of the printed circuit board 10. For each and every via 21,22 of the printed circuit board 10, there will be a corresponding hole 71 formed in the template 70 so that the second layer of the conductive plug may be formed in each and every via 21,22 of the printed circuit board 10.

The stencil 70 is flooded with conductive ink 45. In a preferred embodiment, the conductive ink to form the second layer of the conductive plug is a metal-filled polymer ink having a viscosity of approximately 100,000 cP±50,000 cP, lower than the viscosity of the conductive ink used to form the first layer 61 of the conductive plug. The stencil is flooded with the conductive ink 45 and the conductive ink is forced through the holes 71 of the stencil 70 by use of the squeegee 50 moved once from left to right and once from right to left. This process results in a conductive plug 60 being formed as shown in FIG. 3. FIG. 3 discloses the present invention prior to curing of the second layer 62. The first layer 61 has a relatively smooth underside 68 corresponding to the planar underside 11 of the printed circuit board 10. The second layer 62 of the conductive plug 60 is mounded over the upper surface 12 of the printed circuit board 10. The second layer is cured at 150° C. for fifteen minutes. In order to form a planar upper surface 12 of the printed circuit board 10, the second layer 62 of the conductive plug 60 is scrubbed in order to remove the excess cured polymer ink. The bottom side 11 may also be scrubbed to form a planar surface. In a preferred embodiment, a Somaka board scrubber is used in order to remove the excess portion of the second layer 62 of the conductive plug 60. It can be understood from FIG. 3 that a 90% void-free conductive plug 60 is formed which provides for good conductivity and transfer of electrical signals from the upper side 12 to the under side 11 of the printed circuit board 10. FIG. 3 shows the printed circuit board 10 having the parchment paper removed therefrom. The parchment paper may be removed via any process and preferably it is peeled off from the underside 11 of the printed circuit board 10.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A method of forming conductive plugs in a printed circuit board including the steps of:

providing a circuit board having a top side with conductive patterns thereon and an underside and pre-drilled vias therethrough attaching a parchment paper to the underside of the circuit board covering the pre-drilled vias;

placing the circuit board with the parchment paper covering the vias on a vacuum table;

flooding conductive ink over the top side of the circuit board;

pushing the ink into the vias of the circuit board to form a first layer;

wiping excess ink off the topside of the circuit board in order to isolate the first layer from the conductive patterns on the topside of the circuit board;

curing the first layer of the ink;

placing a stencil over the circuit board and aligning holes of the stencil with the vias of the circuit board;

flooding the stencil with conductive ink;

pushing the ink through the holes in the stencil to form a second layer over the first layer; and curing the second layer of the ink.

2. The method of claim 1 wherein the cured second layer of conductive ink is scrubbed in order to provide a planar surface along the top side of the circuit board.

3. The method of claim 1 wherein a metal-filled polymer ink is used for the first layer within the vias.

4. The method of claim 1 wherein the curing process for both the first and second layers is conducted by placing the circuit board in an oven at 150° C. for fifteen minutes.

5. The process of claim 1 wherein the stencil holes are 5 mm larger in diameter than the via diameters to be filled.

6. The method of claim 1 wherein the conductive ink used to form the second layer has a lower viscosity than the ink to form the first layer.

7. A method of forming plugs in a circuit board having an upper surface and an underside and preformed vias therethrough, wherein approximately 90% of the plug volume is void free, the method including the steps of:

attaching a porous membrane to the underside of the circuit board covering preformed vias;

partially filling a majority of the vias with a polymer based composition from the upper surface, thereby forming a first layer that is spaced from conductive patterns provided on the upper surface of the circuit board and creating a vacant portion within each of the partially filled vias;

curing the first layer; and filling the vacant portion of the vias with a second layer over the first layer.

8. The method of claim 7 wherein the porous membrane is a parchment paper.

9. The method of claim 7 wherein the polymer based composition is an epoxy.

10. The method of claim 7 wherein the polymer based composition is a conductive ink.

11. The method of claim 7 including wherein the vias are filled by flooding the polymer based composition over the circuit board and pushing the polymer based composition into the vias.

12. The method of claim 7 wherein the vias are filled using a stencil.

13. The method of claim 7 wherein the cured first layer is scrubbed in order to provide a planar surface along the upper surface of the circuit board.

14. The method of claim 7 wherein the polymer based composition has a viscosity of at least 50.000 cP.

15. The method of claim 7 including the additional steps of placing a stencil over the circuit board and aligning holes of the stencil with the vias of the circuit board, flooding the stencil with the polymer based composition and pushing the polymer based composition through the holes in the stencil.

16. The method of claim 15 wherein the polymer based composition pushed through the holes of the stencil forms the second layer in the vias.

17. The method of claim 16 wherein the second layer is cured and then scrubbed in order to provide a planar surface along the upper surface of the circuit board.

18. The method of claim 16 wherein the polymer based composition used to form the second layer has a lower viscosity than the polymer based composition used to form the first layer.

* * * * *